United States Patent
Böhm et al.

(10) Patent No.: US 9,466,487 B2
(45) Date of Patent: Oct. 11, 2016

(54) PHOTOLITHOGRAPHIC METHODS OF PRODUCING STRUCTURES IN RADIATION-EMITTING SEMICONDUCTOR COMPONENTS

(71) Applicant: OSRAM Opto Semiconductors GmbH, Regensburg (DE)

(72) Inventors: Bernd Böhm, Obertraubling (DE); Sebastian Hoibl, Regensburg (DE)

(73) Assignee: OSRAM Opto Semiconductors GmbH (DE)

( * ) Notice: Subject to any disclaimer, the term of this patent is extended or adjusted under 35 U.S.C. 154(b) by 0 days.

(21) Appl. No.: 14/460,856

(22) Filed: Aug. 15, 2014

(65) Prior Publication Data
US 2015/0050765 A1 Feb. 19, 2015

(30) Foreign Application Priority Data
Aug. 16, 2013 (DE) .......... 10 2013 108 876

(51) Int. Cl.
*H01L 21/033* (2006.01)
*H01L 33/00* (2010.01)
(Continued)

(52) U.S. Cl.
CPC ......... *H01L 21/0338* (2013.01); *H01L 33/005* (2013.01); *H01L 33/20* (2013.01); *H01L 33/22* (2013.01); *H01L 21/0274* (2013.01)

(58) Field of Classification Search
CPC H01L 21/0338; H01L 33/0095; H01L 33/22
See application file for complete search history.

(56) References Cited

U.S. PATENT DOCUMENTS 5,503,959 A * 4/1996 Langston .............. G03F 7/2022
250/492.2
6,451,508 B1 * 9/2002 Bukofsky .............. G03F 1/144
430/311
(Continued)

FOREIGN PATENT DOCUMENTS

CN 1797199 7/2006
CN 101206407 6/2008
(Continued)

OTHER PUBLICATIONS

English translation of Taiwanese Notification for the Opinion of Examination dated Nov. 16, 2015 from corresponding Taiwanese Application No. 103126322.

*Primary Examiner* — Joseph C Nicely
(74) *Attorney, Agent, or Firm* — DLA Piper LLP (US)

(57) ABSTRACT

A photolithographic method which produces a structure in a radiation-emitting semiconductor component by providing a semiconductor wafer having a semiconductor layer sequence, applying a first photoresist layer to the semiconductor wafer, providing a mask, and arranging the mask relative to the coated semiconductor wafer, exposing the first photoresist layer and imaging the mask in the first photoresist layer, arranging the mask or a different mask relative to the semiconductor wafer at another position different from a first position and again exposing the first photoresist layer and imaging the mask in the first photoresist layer or applying a second photoresist layer to the first photoresist layer, arranging the mask or a different mask relative to the semiconductor wafer at a second position, and exposing the second photoresist layer and imaging the mask in the second photoresist layer, forming a patterned photoresist layer and patterning the semiconductor wafer.

20 Claims, 4 Drawing Sheets

(51) Int. Cl.
   *H01L 33/22* (2010.01)
   *H01L 33/20* (2010.01)
   *H01L 21/027* (2006.01)

(56) References Cited

U.S. PATENT DOCUMENTS

| | | | |
|---|---|---|---|
| 2002/0119402 A1* | 8/2002 | Hsu | G03F 7/70466 430/322 |
| 2007/0003878 A1* | 1/2007 | Paxton | G03F 7/70466 430/311 |
| 2009/0146170 A1* | 6/2009 | Zhong | H01L 33/22 257/98 |
| 2010/0165312 A1* | 7/2010 | Megens | G03B 27/42 355/53 |
| 2011/0101400 A1 | 5/2011 | Chu et al. | |
| 2013/0306976 A1* | 11/2013 | Haruta | H01L 33/32 257/76 |
| 2014/0034980 A1* | 2/2014 | Kazama | H01L 33/22 257/98 |
| 2014/0353709 A1* | 12/2014 | Lee | H01L 33/42 257/99 |
| 2015/0048380 A1* | 2/2015 | Koike | H01L 33/22 257/76 |
| 2015/0188094 A1* | 7/2015 | Sawabe | H01L 51/5275 257/40 |
| 2015/0221824 A1* | 8/2015 | Hatta | H01L 21/0237 257/98 |
| 2015/0311389 A1* | 10/2015 | Lin | H01L 33/22 257/88 |

FOREIGN PATENT DOCUMENTS

| | | |
|---|---|---|
| CN | 103034049 | 4/2013 |
| CN | 103187246 | 7/2013 |
| TW | 495840 | 7/2002 |
| TW | 201118924 | 6/2011 |
| TW | 201248919 | 12/2012 |
| WO | 01/84240 | 11/2001 |

\* cited by examiner

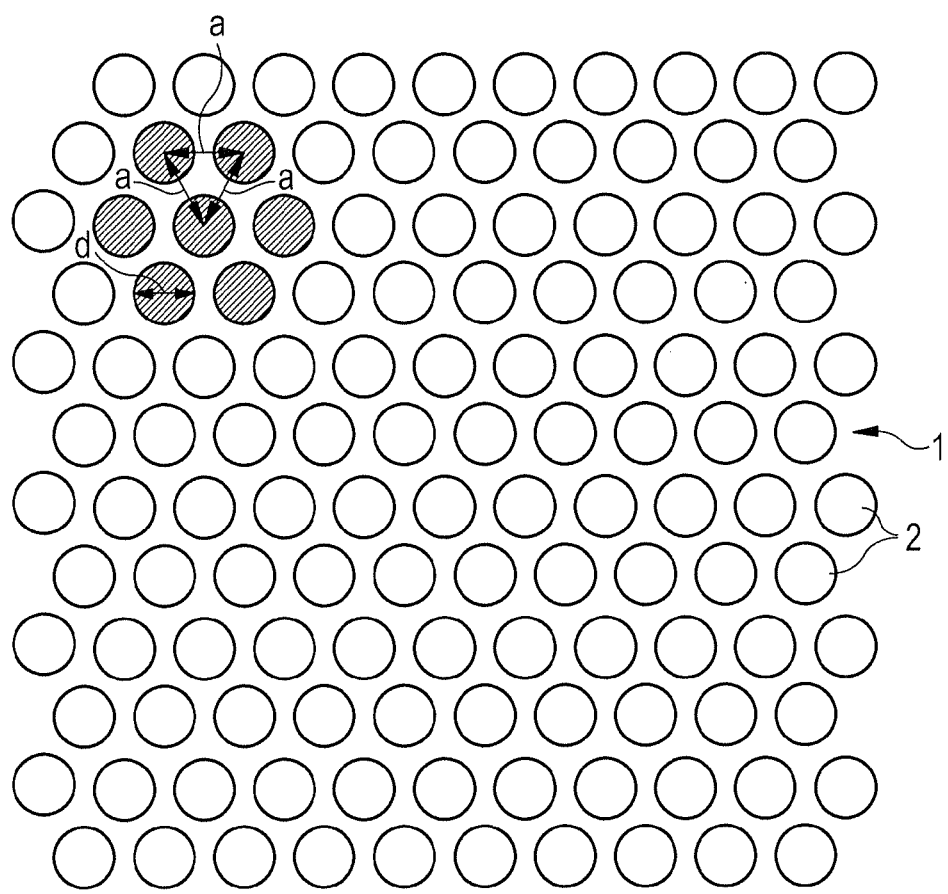

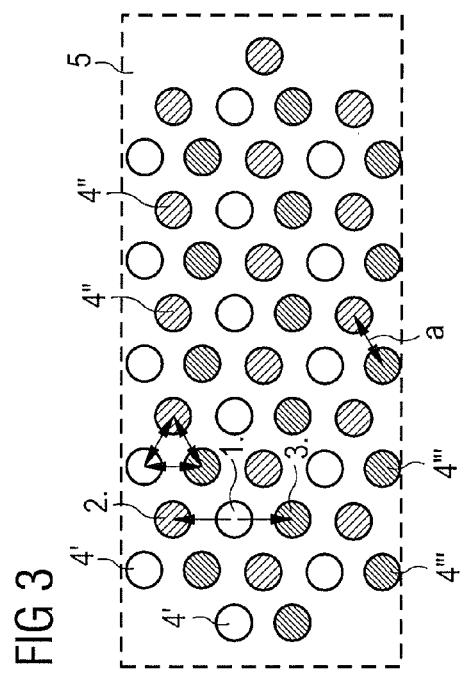
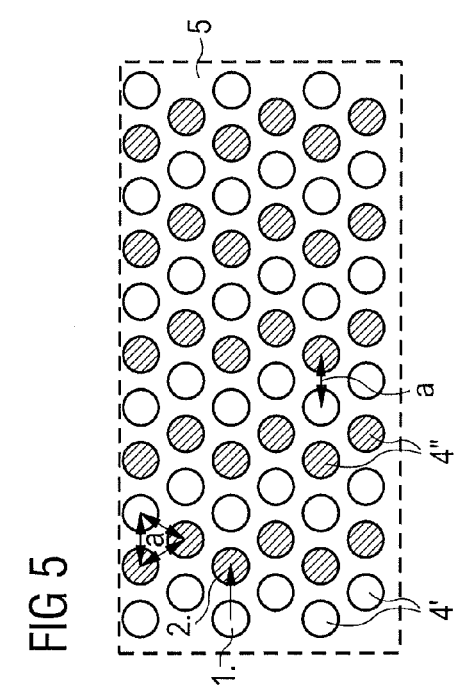
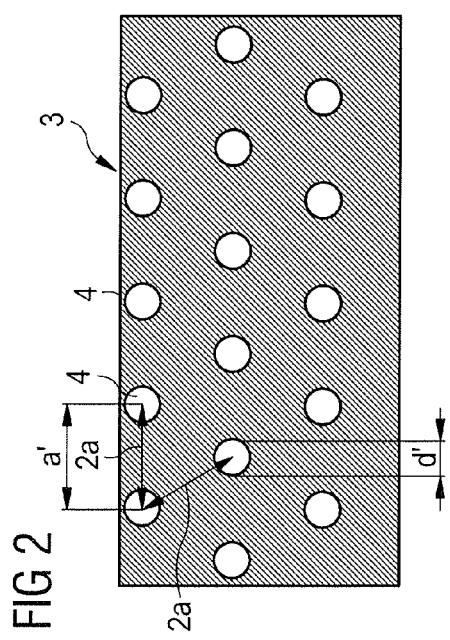
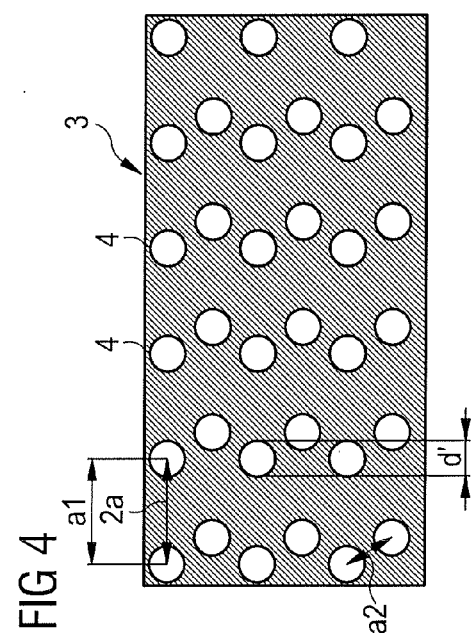

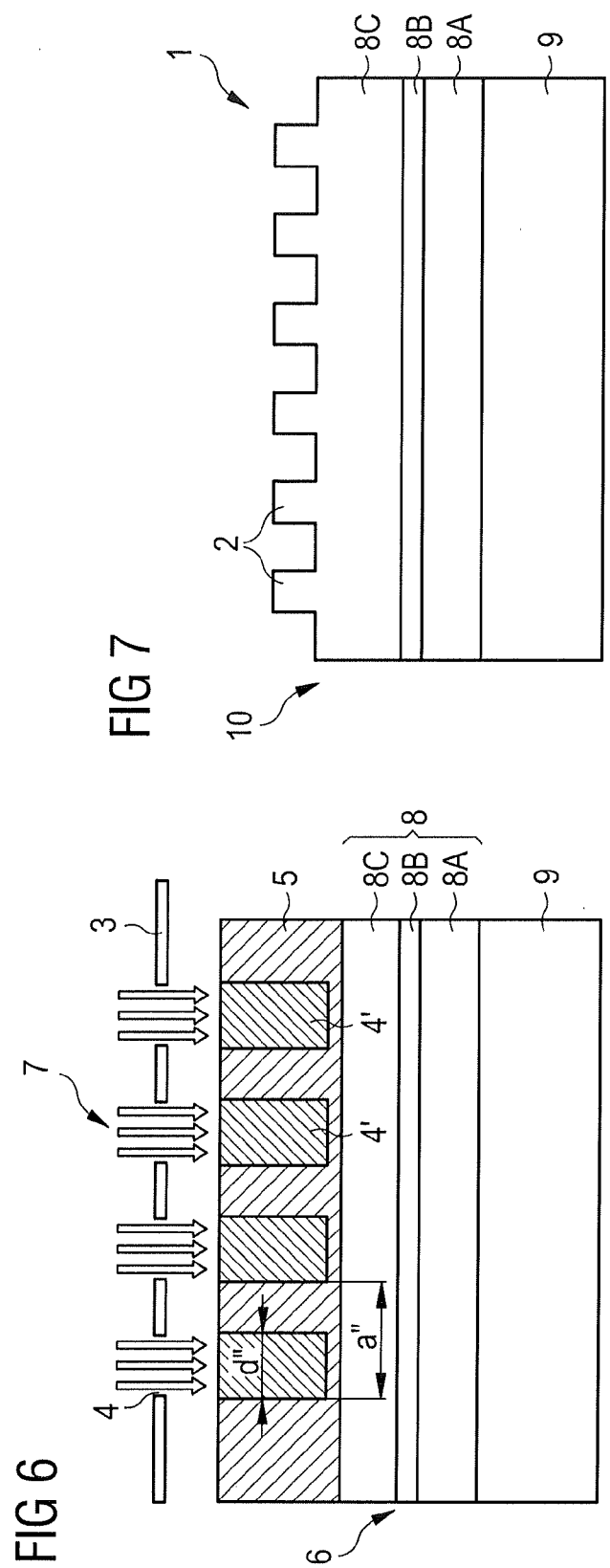

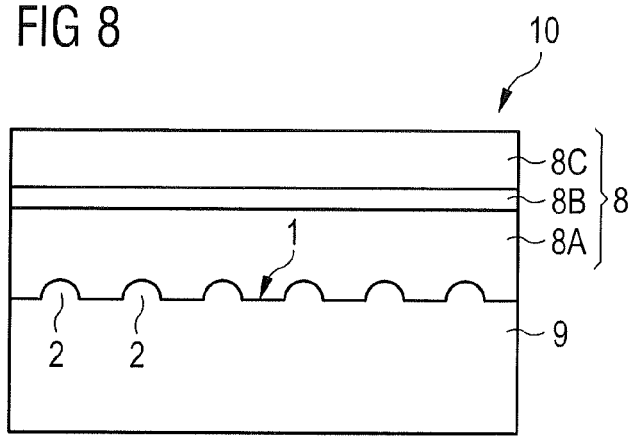
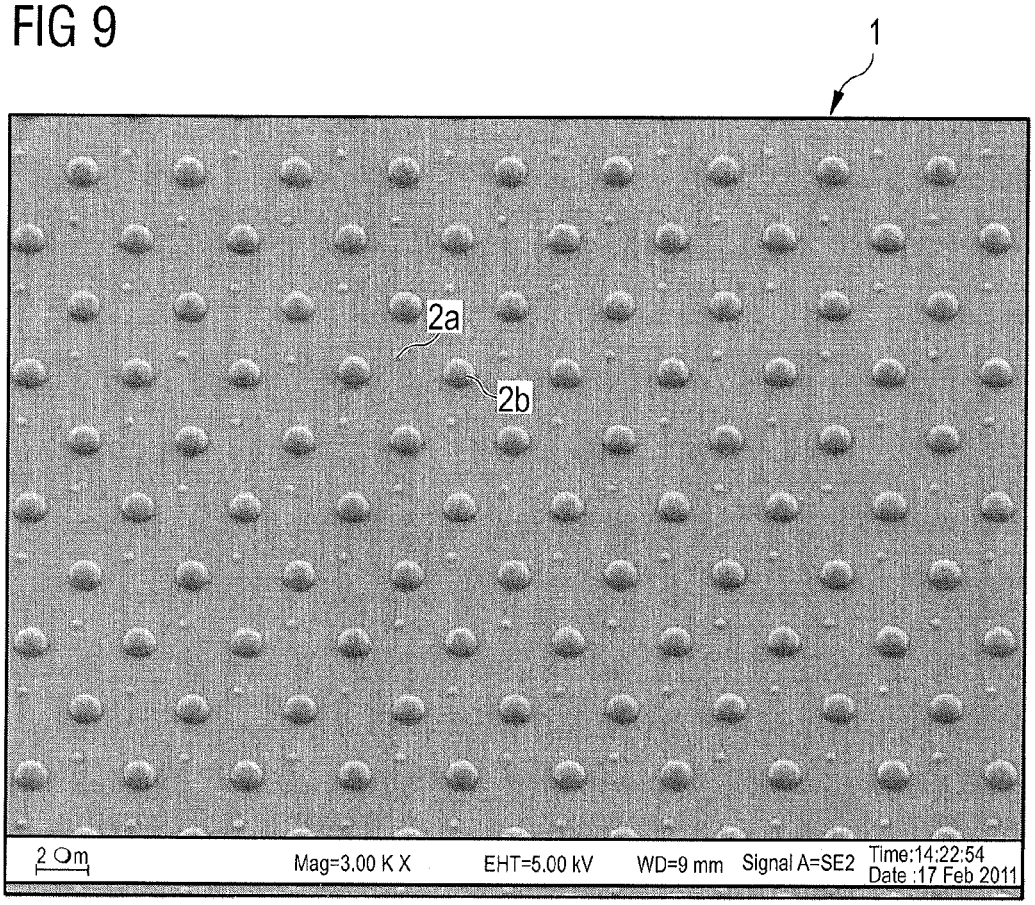

PHOTOLITHOGRAPHIC METHODS OF PRODUCING STRUCTURES IN RADIATION-EMITTING SEMICONDUCTOR COMPONENTS

TECHNICAL FIELD

This disclosure relates to photolithographic methods of producing structures, for example, coupling-out structures, in radiation-emitting semiconductor components. In particular, the methods are suitable for realizing distances between structure elements in the single-digit micrometer range.

BACKGROUND

One method of producing microstructures is projection exposure, for example, in which a mask is demagnified by a lens system and typically imaged on the scale of 5:1 or 4:1, wherein structures of one micrometer or less can be produced by single exposure. Since imaging a mask in that method typically cannot cover an entire wafer, the wafer is moved and positioned such that the images of the mask lie on a grid with narrow tolerances (so-called "step-and-repeat" method). The apparatuses used for this purpose are called "wafer steppers". However, such apparatuses are expensive and not part of standard equipment in the production of radiation-emitting semiconductor components. By way of example, projection exposure apparatuses functioning according to the scanner principle are used in the production of radiation-emitting semiconductor components. In contrast to steppers with the step-and-repeat principle, the mask is illuminated only in a narrow strip and passed through this light strip in a manner similar to that which occurs in line scanners or photocopiers. In that case, the mask is imaged in particular on a scale of 1:1. Hitherto, structure sizes of 2.5 µm with distances of 5 µm have been able to be obtained by single exposure in such exposure apparatuses.

There is, however, a need to provide a lithographic method having improved resolution of producing structures in radiation-emitting semiconductor components.

SUMMARY

We provide a photolithographic method of producing a structure in a radiation-emitting semiconductor component including providing a semiconductor wafer comprising a semiconductor layer sequence to form the radiation-emitting semiconductor component, applying a first photoresist layer to the semiconductor wafer, providing a mask comprising a plurality of mask elements, arranging the mask relative to the coated semiconductor wafer at a first position, exposing the first photoresist layer and imaging the mask in the first photoresist layer, arranging the mask or a different mask relative to the semiconductor wafer at a second position different from the first position, and again exposing the first photoresist layer and imaging the mask in the first photoresist layer or applying a second photoresist layer to the first photoresist layer, arranging the mask or a different mask relative to the semiconductor wafer at a second position different from the first position, and exposing the second photoresist layer and imaging the mask in the second photoresist layer, forming a patterned photoresist layer and patterning the semiconductor wafer by the patterned photoresist layer, wherein a plurality of structure elements are formed at the semiconductor wafer, and a greatest distance between the structure elements is less than a greatest distance between the mask elements, and singulating the semiconductor wafer into a plurality of radiation-emitting semiconductor components each having a structure comprising a plurality of structure elements.

We also provide a photolithographic method of producing a structure in a semiconductor component including providing a semiconductor wafer including a substrate, applying a first photoresist layer to the substrate, providing a mask including a plurality of mask elements, arranging the mask relative to the coated substrate at a first position, exposing the first photoresist layer and imaging the mask in the first photoresist layer, arranging the mask or a different mask relative to the substrate at a second position different from the first position and again exposing the first photoresist layer and imaging the mask in the first photoresist layer or applying a second photoresist layer to the first photoresist layer, arranging the mask or a different mask relative to the substrate at a second position different from the first position, and exposing the second photoresist layer and imaging the mask in the second photoresist layer, forming a patterned photoresist layer and patterning the substrate by the patterned photoresist layer, wherein a plurality of structure elements are formed at the substrate, and a greatest distance between the structure elements is less than a greatest distance between the mask elements, and growing a semiconductor layer sequence onto a substrate surface provided with the structure elements.

BRIEF DESCRIPTION OF THE DRAWINGS

FIG. 1 shows a schematic plan view of a structure having a plurality of structure elements which is produced by a method described herein.

FIG. 2 shows a schematic plan view of a mask for producing a structure as illustrated in FIG. 1 in accordance with a first example.

FIG. 3 shows a schematic plan view of a structure produced with the mask illustrated in FIG. 2.

FIG. 4 shows a schematic plan view of a mask to produce a structure as illustrated in FIG. 1 in accordance with a second example of our methods.

FIG. 5 shows a schematic plan view of a structure produced with the mask illustrated in FIG. 4.

FIG. 6 shows a schematic cross-sectional view of a method step in accordance with one example of our methods.

FIG. 7 shows a schematic cross-sectional view of a radiation-emitting semiconductor component in accordance with one example.

FIG. 8 shows a schematic cross-sectional view of a semiconductor component in accordance with one example.

FIG. 9 shows an SEM micrograph of a structure produced by a method described herein.

DETAILED DESCRIPTION

We provide photolithographic methods of producing structures in radiation-emitting semiconductor components comprising:
  providing a semiconductor wafer comprising a semiconductor layer sequence to form the radiation-emitting semiconductor component,
  applying a first photoresist layer to the semiconductor wafer,
  providing a mask comprising a plurality of mask elements, arranging the mask relative to the coated semiconductor wafer at a first position, exposing the first photoresist layer and imaging the mask in the first photoresist layer, arranging the mask or a different mask relative to the semiconductor wafer at a second position different from the first position and again exposing the first photoresist layer and imaging the mask in the first photoresist layer or applying a second photoresist layer to the first photoresist layer, arranging the mask or a different mask relative to the semiconductor wafer at a second position different from the first position, and exposing the second photoresist layer and imaging the mask in the second photoresist layer, forming a patterned photoresist layer and patterning the semiconductor wafer by the patterned photoresist layer, wherein a plurality of structure elements are formed at the semiconductor wafer, and a greatest distance between the structure elements is less than a greatest distance between the mask elements, and singulating the semiconductor wafer into a plurality of radiation-emitting semiconductor components each having a structure comprising a plurality of structure elements.

Preferably, the method steps are performed successively as listed.

The structure elements produced by the methods described herein may have a three-dimensional shape. The structure elements can be formed, for example, as elevations made from a material of the semiconductor wafer or a layer of the semiconductor wafer such that they are separated from one another by interspaces containing a different material from the structure elements, for example, air. Alternatively, the structure elements can be depressions in the semiconductor wafer or a layer of the semiconductor wafer, wherein the structure elements are surrounded by continuous regions of the semiconductor wafer or the layer of the semiconductor wafer. The depressions can be filled with air, for example.

The structure elements may be hemispherical, cylindrical or prism-shaped. In particular, the mask forming such structure elements may have a two-dimensional arrangement of mask elements having a round or rectangular shape.

The mask elements may be transmissive to the radiation used for exposure. Furthermore, the mask elements can be surrounded by mask regions having a lower radiation transmissivity than the mask elements. By way of example, the mask can be a two-dimensional hole matrix having round or rectangular holes. Such a mask is particularly suitable for the exposure of a resist layer composed of negative resist.

Alternatively, the mask elements can have a low radiation transmissivity to the radiation used for exposure. In particular, the mask elements may be surrounded by mask regions having a higher radiation transmissivity than the mask elements. Such a mask is particularly suitable for the exposure of a resist layer composed of positive resist.

Preferably, the structure elements which can be produced by a method described herein are arranged at regular distances in a common plane. Particularly preferably, a distance between two adjacent structure elements is determined parallel to the common plane. The distances are, in particular, "lateral" distances determined in the common plane. Furthermore, the distance is advantageously specified as the distance between the centroids of two adjacent structure elements. The same correspondingly applies to the distances between the mask elements.

The structure elements can be arranged at identical distances. By way of example, the structure elements can be arranged at lattice points of a two-dimensional point lattice such as, for example, a rectangular or hexagonal point lattice. The mask elements or mask openings in the mask can be arranged at regular distances to realize such an arrangement. By way of example, the mask elements can be arranged at distances of identical magnitude such that two mask elements arranged directly alongside one another are always at identical distances from one another. However, it is also possible in producing structure elements having identical distances, to use a mask in which the distances between two adjacent mask elements are of different magnitudes. By way of example, the mask elements can be arranged more densely in some regions of the mask than in other regions of the mask. In particular, a region of lower density can be arranged between two regions of higher density.

The mask elements of the mask used may have identical sizes. As a result, structure elements of identical size can be produced. By way of example, the mask elements can have substantially a two-dimensional shape such that the "size" of the mask element is characterized in particular by two lateral dimensions along two principal axes of the mask. Since the structure elements have in particular a three-dimensional shape, a vertical dimension is added to the two lateral dimensions for the structure elements, the vertical dimension being arranged transversely, in particular perpendicularly, with respect to the lateral dimensions. In particular, a mask plane spanned by the two principal axes extends parallel to the common plane in which the structure elements are arranged.

Independently of what type of mask is used, whether the mask is one in which the mask elements are arranged at distances of identical magnitude or different magnitudes, the methods are preferably carried out such that structures in which the structure elements are arranged in particular at distances of identical magnitude arise at the end of the method as a result of multiple exposure with a suitable offset of the mask. In particular, the structure elements have identical sizes and are arranged at regular distances, wherein the distances between in each case two directly adjacent structure elements are in particular of identical magnitude. In particular, the "multiple exposure" should be understood to mean that, to produce the structure elements, at least two exposure processes are carried out at different positions.

Preferably, the structure elements in the finished structure touch one another. Such structures are particularly suitable as roughening or coupling-out structures since relatively small interspaces between the structure elements are desired in these structures. Preferably, a largest lateral dimension of the mask elements is smaller than a smallest distance between the mask elements. In particular, the interspaces between the mask elements are chosen precisely with a size such that between two mask elements there is space for precisely one further mask element for the case of double exposure, while there is space for precisely two further mask elements for the case of triple exposure, and so on.

Our methods may be performed in a projection exposure apparatus that operates according to the scanner principle. Furthermore, it is possible to carry out the methods in a so-called "mask aligner." In a mask aligner, the semiconductor wafer is exposed in particular by proximity exposure. In this type of exposure, the mask is positioned at a distance of approximately 10-50 micrometers above the photoresist. Preferably, the mask is imaged on the scale of 1:1 both in the case of projection exposure according to the scanner principle and in proximity exposure.

Advantageously, the methods can be carried out in a contact-free manner by projection exposure or proximity exposure, that is to say that the mask is not arranged in direct contact with a photoresist layer applied on the semiconductor wafer and facing the mask, but rather is at a distance of greater than zero from the layer. As a result, damage to the photoresist layer caused by the mask can be reduced or prevented.

However, it is also possible to carry out a contact exposure in the methods described herein. In this case, the size of and distance between the structure elements that can be produced can be further reduced.

The exposure apparatus comprises a radiation source to generate radiation by which the semiconductor wafer is exposed, and also a mask arranged in the beam path between the radiation source and the semiconductor wafer. By way of example, a laser emitting monochromatic radiation having a wavelength in the UV range can be used as the radiation source.

In an imaging scale of 1:1, the imaged mask pattern is ideally not altered. As a result, it is possible, for example, to produce structure elements corresponding to the mask elements in terms of shape and size. In reality, for example, effects such as overexposure, underexposure or interferences in the case of regularly arranged mask elements can have the consequence that the structure elements produced differ slightly from the mask elements in terms of shape and size.

The mask elements may be imaged distance-faithfully in the first photoresist layer by exposure at the first position, wherein a plurality of first exposed regions are produced. "Distance-faithfully" means, in particular, that a lateral distance between two adjacent mask elements is maintained during the imaging.

Furthermore, the mask elements can be imaged distance-faithfully in the first photoresist layer or second photoresist layer by exposure once again at the second position, wherein a plurality of second exposed regions are produced. In particular, a lateral distance between two adjacent first exposed regions or a lateral distance between two adjacent second exposed regions is greater than a distance between a first and a second adjacent exposed region. The distances are, in particular, "lateral" distances determined in the plane of the photoresist layer. Furthermore, the distance is advantageously specified as the distance between the centroids of two adjacent exposed regions.

Preferably, the number of mask elements corresponds to at least 25% of the total number of structure elements to be produced and less than 100% of the total number of structure elements to be produced. This means that to produce the total number of structure elements, in particular at least two exposure processes are carried out at different positions, wherein the imaged mask elements of each exposure process during the patterning produce a portion of the structure elements to be produced overall. Preferably, the same number of mask elements is imaged during each exposure process. By way of example, in a total of two exposure processes, the imaged mask elements per exposure process during the patterning can produce half of the structure elements to be produced overall. In other words, the structure elements in the finished structure are arranged more densely, that is to say at smaller distances, than the mask elements in the mask.

At least two exposure processes may be carried out until a desired distance between two adjacent exposed regions is attained, and the structure elements may be produced by the exposed regions.

The position change from the first position to the second position may take place in a direction in which the distance between the first exposed regions is greater than a desired distance between the structure elements produced by the exposed regions.

Advantageously, by the methods described herein, with the aid of the multiple exposure, it is possible to choose the distance between the mask elements to be larger than in a single exposure, as a result of which, for example, interference effects can be reduced. The productively utilizable resolution can therefore be increased such that smaller interspaces between the structure elements can be realized.

It is possible to use a single mask to produce the structure elements. During the first exposure pass, the mask is arranged relative to the semiconductor wafer at the first position. During the second exposure pass, the same mask is then arranged offset with respect to the first position at the second position. By using a single mask, it is possible to produce a repeating pattern. In particular, as a result, all the structure elements can be substantially identical in terms of shape and/or size. Alternatively, it is possible to use different masks with different patterns, wherein it is possible to produce structure elements which differ from one another in terms of shape and/or size.

Preferably, a single photoresist layer is applied to the semiconductor wafer. Furthermore, the photoresist layer is preferably exposed at least twice using the same mask, that is to say that at least two exposure processes are carried out using the same mask at the photoresist layer. A photoresist layer composed of negative resist is particularly suitable in this case. In particular, with a negative resist it is readily possible to repeatedly expose a single photoresist layer.

Alternatively, a first and a second photoresist layer can be applied to the semiconductor wafer. Preferably, the first and second photoresist layers are exposed once. In particular, the same mask can be used for the first and second photoresist layers. Furthermore, the same material can be used for the first and second photoresist layers. By way of example, the first photoresist layer can be exposed and developed before the second photoresist layer is applied, exposed and developed. In this case, a positive resist can also be used for the photoresist layer. In this example, the "patterned photoresist layer" is a layer comprising, in particular, the unexposed regions of the first and second photoresist layers.

Suitable photoresists are polymer-containing resists preferably applied to the semiconductor wafer by spin-coating. Novolacs are particularly suitable as positive resists. Photoresist layers having thicknesses of up to a few tens of μm can be obtained.

Advantageously, the distance between the first position and the second position is less than a distance between the mask elements. In particular, the position change leads to a displacement of the mask elements into the interspaces between the mask elements that have already been imaged.

The position change from the first position to the second position may take place by displacement of the mask parallel to a main extension plane of the semiconductor wafer, while the semiconductor wafer remains in its initial position.

Alternatively, the position change from the first to second positions can take place by displacement of the semiconductor wafer along a main extension plane of the semiconductor wafer, while the mask remains in its initial position.

Preferably, the mask plane and the main extension plane are aligned parallel to one another.

Advantageously, by the methods described herein, with a conventional exposure apparatus whose productively utilizable resolution limit in the case of single exposure is 2.5 µm for lateral dimensions and 5 µm for lateral distances, it is possible to produce structure elements having sizes and distances below this resolution limit. In particular, by the methods described herein, it is possible to realize structure elements having lateral dimensions of at least 1 µm and at most 2 µm and distances of at least 2 µm and at most 4 µm.

The positioning accuracy of the exposure apparatus, which can be ±125 nm, suffices for the methods described herein. In particular, inaccuracies in the finished structure can serve as evidence of the multiple exposure. By multiple exposure, the distance between the mask elements can be chosen to be larger than in a single exposure, as a result of which interference effects can be reduced and the imaging quality and thus also the resolution can be improved.

The structure elements may be formed in the semiconductor layer sequences of the semiconductor wafers. The semiconductor layer sequence can comprise an active layer that generates radiation. By way of example, the semiconductor layer sequence or at least one layer of the semiconductor layer sequence can be formed from a material based on nitride compound semiconductors. "Based on nitride compound semiconductors" means that the semiconductor layer sequence comprises a nitride III/V compound semiconductor material, preferably $Al_nGa_mIn_{1-n-m}N$, wherein $0 \leq n \leq 1$, $0 \leq m \leq 1$ and $n+m \leq 1$. In this case, this material need not necessarily have a mathematically exact composition according to the above formula. Rather, it can comprise one or more dopants and additional constituents which substantially do not change the characteristic physical properties of the $Al_nGa_mIn_{1-n-m}N$ material. For the sake of simplicity, however, the above formula includes only the essential constituents of the crystal lattice (Al, Ga, In, N) even if these can be replaced in part by small amounts of further substances.

Furthermore, the semiconductor wafer can comprise a substrate patterned and provided with the structure elements. In particular, the semiconductor layer sequence can be arranged on the substrate, which contains sapphire, for example.

The semiconductor wafer can comprise further layers such as, for example, contact layers or mirror layers, which are metallic layers, in particular, and can be patterned and provided with structure elements.

The semiconductor wafers, after formation of the structure elements, may be singulated into a plurality of radiation-emitting semiconductor components each having a structure comprising a plurality of structure elements.

Further advantages and developments will become apparent from the examples described below in conjunction with FIGS. 1 to 9.

FIG. 1 illustrates a structure 1 produced by a method described here, that is to say in particular by multiple exposure. The structure 1 comprises a plurality of structure elements 2, wherein in each case two directly adjacent structure elements 2 are at a distance a from one another. In particular, the distance a corresponds to the resolution limit and is advantageously at least 2 µm and at most 4 µm.

In the illustrated example, the structure elements 2 are arranged regularly, wherein the distances a are all of identical magnitude. The distances a under consideration are, in particular, lateral distances determined parallel to or in a common plane in which the structure elements 2 are arranged. Furthermore, the distance a is advantageously specified as the distance between the centroids (not identified) of two adjacent structure elements 2.

Furthermore, the structure elements 2 in this example each have a lateral dimension d determined in particular parallel to or in the common plane in which the structure elements 2 are arranged. Preferably, the lateral dimension d is at least 1 µm and at most 2 µm. With further preference, the structure elements 2 are the same shape and size. The structure elements 2 have a two-dimensional shape which is round or circular. The structure elements 2 can have a further lateral dimension (not illustrated), which in particular is of the same magnitude as the lateral dimension d and is arranged transversely, preferably perpendicularly, with respect thereto. Furthermore, the structure elements 2 can have a three-dimensional shape which is hemispherical or cylindrical, for example.

In this example, the structure elements 2 are arranged at lattice points of a hexagonal point lattice.

FIG. 2 shows a first example of a mask 3 to produce a structure 1 as illustrated in FIG. 1. The mask 3 comprises a plurality of mask elements 4, wherein two directly adjacent mask elements 4 are at the distance a' from one another. The distance a' between two directly adjacent mask elements 4 is of a magnitude of, in particular, double the resolution limit obtainable by the multiple exposure described herein, in particular by a projection exposure apparatus operating according to the scanner principle. Preferably, the distance a' is 4 µm.

The mask elements 4 are openings in the mask 3 and surrounded by continuous mask regions. The mask elements 4 have a higher radiation transmissivity than the continuous mask regions. Stray light effects can be reduced by the continuous mask regions, which is advantageous particularly in highly reflective wafer materials such as sapphire or metallic surfaces.

The mask elements 4 are arranged regularly. To produce a structure 1 as illustrated in FIG. 1 in which the structure elements 2 are arranged at identical distances a, the mask elements 4 are also arranged at identical distances a' in this example. The distance a' between two directly adjacent mask elements 4 can be double the magnitude of the distance a between two directly adjacent structure elements 2, that is to say that a'=2a holds true (cf. FIG. 1). The mask elements 4 can likewise be arranged at lattice points of a hexagonal point lattice to produce a hexagonal point lattice. In this case, the density of the mask openings 4 in the mask 3 is advantageously one third of the density of the structure elements 2 in the finished structure 1. In other words, the mask 3 is imaged in particular 3 times until a desired density is attained.

The mask 3 is preferably two-dimensional, that is to say that the length and width of the mask 3 are the relevant dimensions of the mask 3. Correspondingly, the mask elements 4 are also two-dimensional. A lateral dimension d' of the mask elements 4 preferably corresponds to a lateral dimension d of the structure elements 2 to be produced. The mask elements 4 are advantageously imaged shape- and size-faithfully. By way of example, the mask elements 4 are round or circular, wherein the lateral dimension d' corresponds to the diameter. The lateral dimension d' can assume values in the range of the resolution limit and can be approximately 1 µm.

The mask 3 is imaged repeatedly into a photoresist layer 5 to produce the structure 1 in which the structure elements 2 are arranged at distances a of identical magnitude. As illustrated in FIG. 3, the mask elements 4 are first imaged at a first position in the photoresist layer 5, wherein a plurality of first exposed regions 4' are produced. The mask 3 and the photoresist layer 5 or a semiconductor wafer are then arranged offset relative to one another such that the mask 3 is situated at a second position (cf. arrow). The mask elements 4 are then imaged at the second position, wherein a plurality of second exposed regions 4" are produced. Finally, the mask 3 and the photoresist layer 5 or the semiconductor wafer are arranged offset relative to one another a second time such that the mask 3 is situated at a third position different than the first and second positions (cf. arrow). The mask elements 4 are then imaged at the third position, wherein a plurality of third exposed regions 4''' are produced.

In particular, the position changes take place such that the distance between two adjacent exposed regions 4', 4", 4''' after the renewed exposure is less than before the renewed exposure.

After the conclusion of the exposure processes, the distance between two directly adjacent exposed regions 4', 4", 4''' preferably corresponds to the desired distance a between the structure elements 2 (cf. FIG. 1).

FIG. 4 shows a second example of a mask 3 to produce a structure 1 as illustrated in FIG. 1. The mask 3 comprises a plurality of mask elements 4, which are mask openings, in particular. The mask elements 4 are arranged regularly. However, the mask elements 4 are arranged at distances a1, a2 of different magnitudes. The larger distance a1 between two directly adjacent mask elements 4 can be double the magnitude of the distance a between two directly adjacent structure elements 2 to be produced, that is to say that a1=2a holds true. The distance a1 between two directly adjacent mask elements 4 can therefore be 4 µm. Furthermore, the smaller distance a2 between two directly adjacent mask elements 4 can be of the same magnitude as the distance a between two directly adjacent structure elements 2 to be produced, that is to say that a2=a holds true. The distance a2 can therefore be 2 µm. The different distances a1, a2 result in regions of a higher density of mask elements 4 and of a lower density of mask elements 4, wherein in particular a region of lower density is arranged between two regions of higher density. In particular, the density of the mask elements 4 in the mask 3 in this example is half the magnitude of the density of the structure elements 2 in the finished structure 1.

The mask 3 is preferably two-dimensional. Correspondingly, the mask elements 4 are also two-dimensional. A lateral dimension d' of the mask elements 4 preferably corresponds to a lateral dimension d of the structure elements 2 to be produced. Preferably, the mask elements 4 are circular such that the lateral dimension d' corresponds to the diameter, wherein d' is approximately equal to 1 µm.

The mask 3 is imaged into a photoresist layer 5 twice to produce the finished structure 1 in which the structure elements 2 are arranged at distances a of identical magnitude. As illustrated in FIG. 5, the mask 3 is imaged at a first position, wherein a plurality of first exposed regions 4' are produced. The mask 3 and the photoresist layer 5 are then arranged offset relative to one another such that the mask 3 is situated at a second position. The mask 3 is then imaged at the second position, wherein a plurality of second exposed regions 4" are produced. The position change takes place in a direction in which the distance between the first exposed regions 4' is intended to be reduced.

In this example, too, the distance between two directly adjacent exposed regions 4', 4" after the conclusion of the exposure processes advantageously corresponds to the desired distance a between the structure elements 2 (cf. FIG. 1).

FIG. 6 shows a method step of a method described herein in which the photoresist layer 5 arranged on a semiconductor wafer 6 is exposed for the first time. The mask 3 is arranged at a distance of greater than zero on the photoresist layer 5 such that the exposure takes place in a contact-free fashion. The photoresist layer 5 is exposed through the mask openings 4 with radiation 7 coming from a radiation source (not illustrated).

A negative resist may be used for the photoresist layer 5. The solubility of the exposed regions 4' decreases as a result of the exposure. The distances a" between the exposed regions 4' preferably correspond to the distances a' or a1 between the mask openings 4 (cf. FIGS. 2 and 4). In other words, the mask elements 4 are imaged distance-faithfully in the photoresist layer 5. Furthermore, a lateral dimension d" of the exposed regions 4' preferably corresponds to a lateral dimension d' of the mask openings 4 (cf. FIGS. 2 and 4). In other words, the mask elements 4 are imaged size-faithfully in the photoresist layer 5. This also applies to a second exposure process (not illustrated).

The exposed regions 4' (and the exposed regions 4", 4''', cf. FIGS. 3 and 5) then remain during development, that is to say that the photoresist layer 5 is patterned. In the interspaces between the developed regions, the semiconductor wafer 6 can be etched in a subsequent method step such that structure elements are formed (not illustrated). The semiconductor wafer 6 is therefore patterned by the patterned photoresist layer 5.

The semiconductor wafer 6 comprises a semiconductor layer sequence 8 and a substrate 9 on which the semiconductor layer sequence 8 is arranged. The semiconductor layer sequence 8 comprises a first semiconductor layer 8A adjoining the substrate 9, and a second semiconductor layer 8C adjoining the photoresist layer 5, and an active layer 8B arranged between the first and second semiconductor layers 8A, 8C. The second semiconductor layer 8C may be patterned. The result of the patterning and of the subsequent singulation is illustrated in FIG. 7.

FIG. 7 shows one example of a radiation-emitting semiconductor component 10 produced in accordance with a methods described herein. The radiation-emitting semiconductor component 10 comprises an active layer 8B that generates radiation. A structure 1 having a plurality of structure elements 2 is arranged at an outer side of the semiconductor component 10, the structure preferably being that as illustrated in FIG. 1. In particular, the structure elements 2 are elevations in second semiconductor layer 8C. The structure 1 is suitable as a coupling-out structure to improve the coupling-out of light from the semiconductor component 10.

FIG. 8 shows one example of a semiconductor component 10 that, in particular, emits radiation. In this case, the substrate 9, on which the semiconductor layer sequence 8 is arranged, is provided with a structure 1 produced in accordance with a method described herein. The structure 1 is arranged at a surface of the substrate 9 in contact with the semiconductor layer sequence 8. Preferably, the semiconductor layer sequence 8 is grown onto the surface provided with the structure 1. The structure 1 has a plurality of structure elements 2 which are hemispherical in this example.

By way of example, the substrate 9 can be formed from sapphire and is thus particularly well suited to coupling out blue light preferably emitted by the active layer 8B in the case where AlInGaN is used for the active layer.

The structure 1 illustrated in FIG. 9 arose by single exposure of a first and a second photoresist layer composed of positive resist. In this case, the solubility of the exposed regions increases as a result of exposure. By way of example, it is possible to use a mask comprising mask elements which do not or hardly transmit the radiation at the locations at which structure elements are intended to be formed. Subsequently, the first photoresist layer is developed, only the unexposed regions remaining. These regions can then be cured, for example, by thermal baking such that it is not possible to develop the photoresist layer a second time. Therefore, a second photoresist layer is applied and exposed using the same mask at a second position. After the second photoresist layer has been developed, the semiconductor wafer can be etched. The structure elements 2a produced by the first photoresist layer, in the finished structure, can have a smaller height than the structure elements 2b produced by the second photoresist layer.

Our methods and components are not restricted by the description on the basis of the examples. Rather, this disclosure encompasses any novel feature and also any combination of features, which in particular includes any combination of features in the appended claims, even if the feature or combination itself is not explicitly specified in the claims or examples.

We claim:

1. A photolithographic method of producing a structure in a radiation-emitting semiconductor component comprising:
   providing a semiconductor wafer comprising a semiconductor layer sequence to form the radiation-emitting semiconductor component,
   applying a first photoresist layer to the semiconductor wafer,
   providing a mask comprising a plurality of mask elements,
   arranging the mask relative to the coated semiconductor wafer at a first position,
   exposing the first photoresist layer and imaging the mask in the first photoresist layer,
   applying a second photoresist layer to the first photoresist layer, arranging the mask or a different mask relative to the semiconductor wafer at a second position different from the first position, and exposing the second photoresist layer and imaging the mask or the different mask in the second photoresist layer,
   forming a patterned photoresist layer and patterning the semiconductor wafer by the patterned photoresist layer, wherein a plurality of structure elements are formed at the semiconductor wafer, and a greatest distance between the structure elements is less than a greatest distance between the mask elements, and the structure elements produced by the first photoresist layer have a smaller height than the structure elements produced by the second photoresist layer, and
   singulating the semiconductor wafer into a plurality of radiation-emitting semiconductor components each having a structure comprising a plurality of structure elements.

2. The method according to claim 1, wherein the structure elements in the finished structure are arranged more densely than the mask elements in the mask.

3. The method according to claim 1, wherein, by exposure at the first position, the mask elements are imaged distance-faithfully in the first photoresist layer and a plurality of first exposed regions are produced.

4. The method according to claim 3, wherein, by said exposure at the second position, the mask elements are imaged distance-faithfully in the second photoresist layer and a plurality of second exposed regions are produced, and a distance between two adjacent first exposed regions or a distance between two adjacent second exposed regions is greater than a distance between a first and a second adjacent exposed region.

5. The method according to claim 3, wherein the position change from the first position to the second position takes place in a direction in which the distance between the first exposed regions is greater than a selected distance between the structure elements produced by the exposed regions.

6. The method according to claim 5, wherein at least two exposure processes are carried out until a selected distance between two adjacent exposed regions is attained, and the structure elements are produced by the exposed regions.

7. The method according to claim 1, wherein the distance between the first position and the second position is less than the distance between the mask elements.

8. The method according to claim 1, wherein the mask elements have identical sizes and are arranged at regular distances, and two directly adjacent mask elements are always at substantially identical distances from one another.

9. The method according to claim 1, wherein the mask comprises regions of higher density of mask elements and of lower density of mask elements, and the mask elements have identical sizes and are arranged at regular distances within each respective region.

10. The method according to claim 1, wherein the same mask is used for the first and second photoresist layers.

11. The method according to claim 10, wherein a positive resist is used for the first and second resist layers.

12. The method according to claim 1, wherein a negative resist is used for the resist layer.

13. The method according to claim 1, wherein a position change from the first position to the second position takes place by displacement of the semiconductor wafer along a main extension plane of the semiconductor wafer, while the mask remains in its initial position.

14. The method according to claim 1, wherein a relative position change from the first position to the second position takes place by displacement of the mask parallel to a main extension plane of the semiconductor wafer, while the semiconductor wafer remains in an initial position.

15. The method according to claim 1, wherein the structure in the semiconductor components is a coupling-out structure.

16. The method according to claim 1, wherein the structure elements in the finished structure touch one another.

17. A photolithographic method of producing a structure in a semiconductor component comprising:
   providing a semiconductor wafer comprising a substrate,
   applying a first photoresist layer to the substrate,
   providing a mask comprising a plurality of mask elements,
   arranging the mask relative to the coated substrate at a first position,
   exposing the first photoresist layer and imaging the mask in the first photoresist layer,
   applying a second photoresist layer to the first photoresist layer, arranging the mask or a different mask relative to the substrate at a second position different from the first position, and exposing the second photoresist layer and imaging the mask in the second photoresist layer,
   forming a patterned photoresist layer and patterning the substrate by the patterned photoresist layer, wherein a plurality of structure elements are formed at the substrate, and a greatest distance between the structure elements is less than a greatest distance between the mask elements, and the structure elements produced by means of the first photoresist layer have a smaller height than the structure elements produced by means of the second photoresist layer, and growing a semiconductor layer sequence onto a substrate surface provided with the structure elements.

18. The method according to claim 1, wherein the first photoresist layer is exposed, developed and cured before the second photoresist layer is applied, exposed and developed.

19. A photolithographic method of producing a structure in a radiation-emitting semiconductor component comprising:

providing a semiconductor wafer comprising a semiconductor layer sequence to form the radiation-emitting semiconductor component, applying a first photoresist layer to the semiconductor wafer, providing a mask comprising a plurality of mask elements, arranging the mask relative to the coated semiconductor wafer at a first position, exposing the first photoresist layer and imaging the mask in the first photoresist layer, applying a second photoresist layer to the first photoresist layer, arranging the mask or a different mask relative to the semiconductor wafer at a second position different from the first position, and exposing the second photoresist layer and imaging the mask or the different mask in the second photoresist layer, wherein the first photoresist layer is exposed, developed and cured before the second photoresist layer is applied, exposed and developed, forming a patterned photoresist layer and patterning the semiconductor wafer by the patterned photoresist layer, wherein a plurality of structure elements are formed at the semiconductor wafer, and a greatest distance between the structure elements is less than a greatest distance between the mask elements, and singulating the semiconductor wafer into a plurality of radiation-emitting semiconductor components each having a structure comprising a plurality of structure elements.

20. A photolithographic method of producing a structure in a semiconductor component comprising:

providing a semiconductor wafer comprising a substrate, applying a first photoresist layer to the substrate, providing a mask comprising a plurality of mask elements, arranging the mask relative to the coated substrate at a first position, exposing the first photoresist layer and imaging the mask in the first photoresist layer, applying a second photoresist layer to the first photoresist layer, arranging the mask or a different mask relative to the substrate at a second position different from the first position, and exposing the second photoresist layer and imaging the mask in the second photoresist layer, wherein the first photoresist layer is exposed, developed and cured before the second photoresist layer is applied, exposed and developed, forming a patterned photoresist layer and patterning the substrate by the patterned photoresist layer, wherein a plurality of structure elements are formed at the substrate, and a greatest distance between the structure elements is less than a greatest distance between the mask elements, and growing a semiconductor layer sequence onto a substrate surface provided with the structure elements.

* * * * *